United States Patent [19]

Uetrecht et al.

[11] Patent Number: 4,731,729

[45] Date of Patent: Mar. 15, 1988

[54] ELECTRONIC DIGITAL DUAL SEQUENTIAL TIMING CONTROL APPARATUS FOR ENVIRONMENTAL SYSTEMS

[75] Inventors: Dale M. Uetrecht, Cincinatti; Carlton J. Simmons, West Chester, both of Ohio

[73] Assignee: Baldwin Piano & Organ Company, Loveland, Ohio

[21] Appl. No.: 923,369

[22] Filed: Oct. 27, 1986

[51] Int. Cl.$^4$ .............................................. G06F 15/20
[52] U.S. Cl. .................................................. 364/505
[58] Field of Search ............... 364/200, 900, 505, 550, 364/557

[56] References Cited

U.S. PATENT DOCUMENTS

| | | | |
|---|---|---|---|
| 4,253,153 | 2/1981 | Bitterli et al. | 364/505 |
| 4,276,925 | 7/1981 | Palmieri | 364/505 |
| 4,430,828 | 2/1984 | Oglevee et al. | 364/505 |
| 4,527,247 | 7/1985 | Kaiser et al. | 364/900 |

Primary Examiner—Gareth D. Shaw
Assistant Examiner—John G. Mills
Attorney, Agent, or Firm—Kirkland & Ellis

[57] ABSTRACT

An electronic digital timing control apparatus for controlling different durations for two sequential events in alternation, especially in environmental systems. The timing control apparatus is programmable and contains a single oscillator and a binary counter which counts a predetermined fixed number of output cycles from the oscillator. At one end of the first count, tuning components for the oscillator are switched in order to change the oscillator frequency and thereby the duration for the next count for the next corresponding event.

1 Claim, 2 Drawing Figures

ELECTRONIC DIGITAL DUAL SEQUENTIAL TIMING CONTROL APPARATUS FOR ENVIRONMENTAL SYSTEMS

BACKGROUND OF THE INVENTION

1. Field of the Invention

This invention relates to digital programmable timers and, more specifically, to digital programmable timers for environmental control systems.

2. Description of the Prior Art

Timing controllers are used for many purposes, especially in environmental control systems for buildings. Often one function is needed in sequence or in alternation with another function, with a need for timing both functions. It is desirable to be able to control independently the duration of each timing event or function operation. Typical dual (or multiple) sequential timing controllers use two (or more) timers connected in cascade so that one is on when another is off and vice versa, with each timer independently set for duration.

Most modern timing control systems use some type of digital electronic programmable timer circuits. Although such circuits have become more readily available and more easily adaptable to various controlling functions in recent years, their cost is still considerable, justifiably in view of their internal complexity of operation. Moreover, this internal complexity of each timing controller raises questions concerning reliability and "fail-safe" operation of the system when two (or more) digital programmable timers are needed.

SUMMARY OF THE INVENTION

Accordingly, it is an object of the invention to provide satisfactory control of the timing of the duration of two or more sequential events, operations or processes by a simpler, less costly and more reliable means.

The above and other objects of the invention are accomplished through the use of a single digital programmable timer. When the timer is actuated, it first counts a preselected number of cycles of the output signal from a tuned oscillator within the timer, and then switches the status of the timer output control signal. The timer output control signal not only serves its purpose by terminating the first event and starting the second event, it also simultaneously causes the circuit of the invention to switch the oscillator to a different frequency and start the counting of cycles of the oscillator output signal at the new frequency. When this second count is completed, the output control signal reverses to the first state, terminating the second event and causing the first event to reoccur and be timed as before at the first oscillator frequency. Independent means are provided for changing the oscillator frequencies, and hence the respective time durations of the events. Since the desired results are achieved using a single programmable timer, rather than the two commonly used previously, the stated object of the invention is fulfilled.

DETAILED DESCRIPTION OF THE PREFERRED EMBODIMENT

Figure 1:
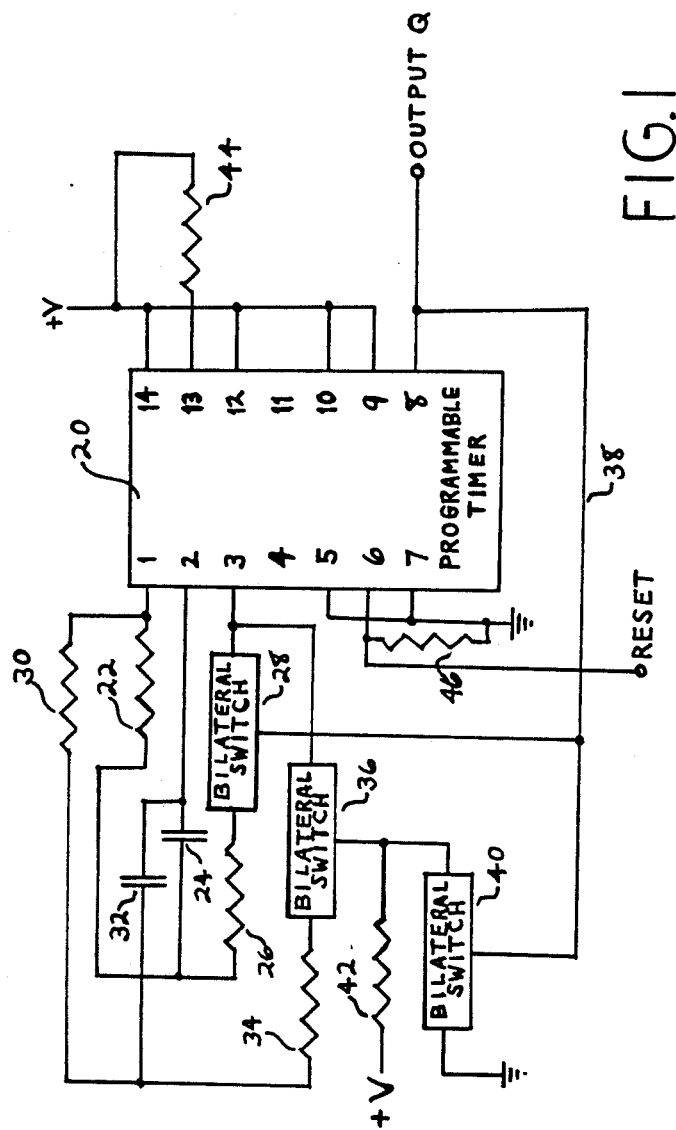
FIG. 1 is an electrical schematic diagram of the preferred embodiment of the present invention in which the programmable timer and the electronic switches are connected blocks.

A sequential timing control apparatus according to a preferred embodiment of the present invention will be described with reference to the accompanying drawings. Referring to FIG. 1, digital programmable timer 20, having pins 1-14, is powered by the application to its terminal 14 of dc potential (+V) (typically 15 volts) supplied normally from a system sensor such as, for example, the thermostat switch of an environmental control system. The timer can be implemented by RCA Type CD4541B described on pages 356-359 of the RCA data catalog for CMOS Integrated Circuits, copyright 1983. At pin 8 of programmable timer 20, a binary output control signal Q is produced which, over a period of time, will switch between its two values in accordance with the operation of timer 20 and the associated circuitry. The first duration period timed begins when potential +V is applied to pin 14, which starts an oscillator within timer 20. The oscillator operation during this first period is controlled by three external components, resistor 22 connected to pin 1, capacitor 24 connected to pin 2, and resistor 26 connected to pin 3 when bilateral switch 28 is closed. Alternatively, during the second timed duration period, the internal oscillator operation is controlled by three other external components, resistor 30 also connected to pin 1, capacitor 32 also connected to pin 2, and resistor 34 also connected to pin 3 when bilateral switch 36 is closed.

Initially when +V is applied to pin 14, output control signal Q on feedback path 38 is set to +V causing bilateral switches 28 and 40 to close. All three bilateral switches 28, 36 and 40 can be implemented by using three sections of an RCA type CD4066B Quad Bilateral Switch, described on pages 226-230 of the RCA data catalog for CMOS Integrated Circuits, copyright 1983. Closing of switch 28 connects components 22, 24 and 26 to the oscillator. The simultaneous closing of switch 40 grounds the input to switch 36, opening switch 36 so that components 30, 32 and 34 are disconnected from the oscillator, allowing components 22, 24 and 26 to control the oscillator's frequency and operation. Later, at the end of the first duration period when the state of the output control signal reverses, bilateral switches 28 and 40 are opened, disconnecting components 22, 24 and 26 from the oscillator, and potential +V through isolating resistor 42 closes bilateral switch 36 connecting components 30, 32 and 34 to the oscillator to operate the oscillator at a different frequency during the second duration period.

For normal operation, pin 7 is connected to ground, and pin 5 is connected to ground to cause the programmable timer 20 to reset itself automatically at the end of each timed duration period. If at any time and for any reason one wishes to restart at the beginning of the first event, a positive restart pulse can be applied to pin 6. Normally pin 6 is referenced to ground through R46. Keeping pin 9 at +V keeps output control signal Q at full value immediately after reset. Keeping pin 10 at +V allows the internal counter to recycle continuously.

A 16 stage binary counter within the programmable timer 20 performs the actual timing function. The actual count ($2^N$) is selectable and is a function of the logic state applied to pins 12 and 13. The application of +V (logic 1) to pin 12 and to pin 13 via resistor 44 selects a full count of $2^{16}$ or 65,536. Resistor 44 allows for the grounding of pin 13 for test purposes. Output from pin 8 will change state after $2^{N-1}$ counts.

This change of output state controls the on/off operation(s) required by, for example, the defrost cycle of an environmental control system. Interface between the output Q and the external system typically is accomplished through a relay or a triac.

Figure 2:
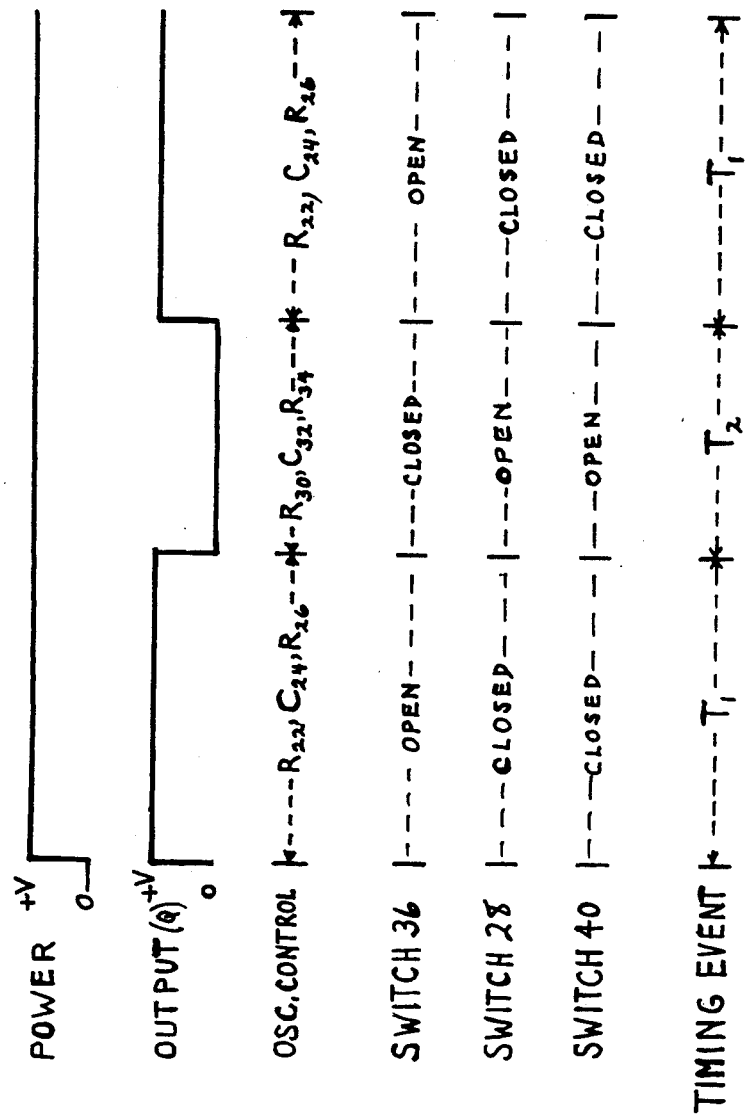
FIG. 2 is a timing chart explaining the operation of the preferred embodiment of the present invention.

Using the preceding description of the FIG. 1 circuit of the preferred embodiment of the invention, the detailed operation can be summarized with reference to FIG. 2. When potential $+V$ in FIG. 2 is received from a system sensor, the programmable timer 20 is automatically reset to time the first event by the auto-reset feature of the timer controlled by grounding of pin 5 and application of $+V$ to pin 10. Output control signal Q is set to $+V$, which is transmitted to the remote equipment for the first timed period, and which applies $+V$ through line 38 to the control inputs of the bilateral switches 28 and 40 causing switches 28 and 40 to close as shown in FIG. 2. With switch 40 closed, the control input to bilateral switch 36 is grounded through switch 40, causing switch 36 to open as shown in FIG. 2, which disconnects external components 30, 32, 34, leaving external components 22, 24 and 26 connected through bilateral switch 28 to control timer oscillator, as shown in FIG. 2. During the first timing event, the oscillator operates at a frequency controlled by resistor 22 and capacitor 24 for a duration period $T_1$ in FIG. 2 determined by $$T_1 = 2^N (0.019)(R_{22}C_{24}), \text{ when } R_{26} \approx 2R_{22}$$
where $T_1$ is in minutes During this period $T_1$ the 16 stage binary counter of the programmable timer 20 is counting cycles of the internal oscillator by dividing the oscillator frequency by $2^N$ where N=16 or a ratio of 65,536 to 1. The output Q remains high until count $2^{N-1}$ or count 32,768 occurs at which time output Q goes to ground, terminating the first timing event at $t = T_1$ in FIG. 2.

With output Q at ground, the control inputs to bilateral switches 28 and 40 are grounded, and opened. With switch 40 open, the control input to bilateral switch 36 is disconnected from ground and set high through resistor 42 connected to $+V$, causing switch 36 to close.

Then with switch 28 open and switch 36 closed, the second timing event begins, and the internal oscillator of programmable timer 20 runs at a new frequency determined by the values of resistor 30 and capacitor 32. The 16 stage binary counter of timer 20 continues to count toward 65,536 at a different rate by dividing the new oscillator frequency by $2^N$ where N=16. The dividing ratio does not change between the two timing events, just the frequency of the oscillator changes.

When the 16 stage binary counter reaches count 65,536, output control signal Q switches back to $+V$ terminating the second timing event at a duration $T_2$ in FIG. 2 determined by $$T_2 = 2^N (0.019)(R_{30}C_{32}), \text{ when } R_{34} \approx 2R_{30}$$
where $T_2$ is in minutes Since pin 10 of programmable timer 20 is connected to $+V$, the timer is in an automatic recycle mode. Consequently, the first event begins again as shown in FIG. 2 and the timing events reoccur in continuous alternation, switching output control signal Q alternately between $+V$ and ground after the predetermined intervals $T_1$ and $T_2$ as long as $+V$ is supplied by the system sensor.

As has been apparent from the above description, this invention makes possible the timing control of dual unequal sequential events, operations or processes through the use of a single digital programmable timer.

It should be noted that the above description and drawings are illustrative only, as one of ordinary skill in the art would recognize, that various modifications could be made in the methods herein employed without departing from the spirit or scope of the present invention which is to be limited only by the following claims.

What is claimed is:

1. In an environmental control system a digital programmable timer for controlling at least two sequentially timed events, said timer comprising:
   oscillator means for providing an output signal of variable frequency, said oscillator means having a selectable set of tuning components for each sequentially timed event, wherein the set of tuning components selected determines the frequency of said oscillator means;
   binary counter means for counting the cycles of the output signal of said oscillator means and providing an output control signal having a different state for each set of tuning components, wherein said binary counter means changes the state of its output control signal when it has counted a predetermined number of cycles of the output signal from said oscillator means; and
   switching means responsive to said output control signal for terminating the sequentially timed event corresponding to the set of tuning components currently selected, selecting the set of tuning components for determining the frequency of the output signal of said oscillator means corresponding to the next of the sequentially timed events, and initiating the next sequentially timed event.

* * * * *